United States Patent [19]

Takagi

[11] Patent Number: 4,782,364

[45] Date of Patent: Nov. 1, 1988

[54] RECORDING APPARATUS

[75] Inventor: Osamu Takagi, Nagoya, Japan

[73] Assignee: Brother Kogyo Kabushiki Kaisha, Nagoya, Japan

[21] Appl. No.: 131,807

[22] Filed: Dec. 11, 1987

[30] Foreign Application Priority Data

Dec. 26, 1986 [JP] Japan .................................. 61-313059

[51] Int. Cl.⁴ .............................................. G03B 27/52
[52] U.S. Cl. ...................................... 355/30; 354/302; 355/27
[58] Field of Search ............................ 355/27, 28, 30; 354/301-305, 86, 297, 339; 430/138, 211, 235, 962

[56] References Cited

U.S. PATENT DOCUMENTS

| | | | |
|---|---|---|---|
| 4,448,516 | 5/1984 | Arney et al. | 355/27 |
| 4,624,560 | 11/1986 | Beery | 355/27 |
| 4,648,699 | 3/1987 | Holycross et al. | 355/27 X |
| 4,714,943 | 12/1987 | Sakakibara et al. | 355/27 |
| 4,727,392 | 2/1988 | Stone et al. | 355/27 X |
| 4,737,822 | 4/1988 | Taniguchi et al. | 355/27 |
| 4,740,809 | 4/1988 | Yamamoto et al. | 355/27 |
| 4,742,374 | 5/1988 | Yamamoto et al. | 355/27 |

Primary Examiner—Richard A. Wintercorn
Attorney, Agent, or Firm—Kane, Dalsimer, Sullivan, Kurucz, Levy, Eisele and Richard

[57] ABSTRACT

Disclosed is a recording apparatus which comprises exposing means for exposing a photo-pressure recording sheet carrying at least microcapsules on a surface thereof, pressing means for pressing the exposed photo-pressure recording sheet so as to break ones of the microcapsules, and cleaning means provided in the vicinity of the pressing means for removing foreign matters mainly containing the contents of microcapsules and attached to the pressing means.

8 Claims, 3 Drawing Sheets

FIG_2

RECORDING APPARATUS

BACKGROUND OF THE INVENTION

1. Field of the Invention

The present invention generally relates to a recording apparatus and particularly relates to a recording apparatus for performing recording on a photo-pressure sensitive recording medium.

2. Description of Prior Art

Of the photo-pressure sensitive recording media, there have been a photo-pressure sensitive recording sheet of the self-coloring type in which both microcapsules and a developer are applied on one end and the same recording sheet, and a photo-pressure sensitive recording sheet of the transfer type which is constituted by a microcapsule sheet carrying only microcapsules applied thereon, and a developer sheet carrying a developer applied thereto.

In the case of the photo-pressure sensitive recording sheet of the self-coloring type, exposure is performed on the recording sheet on the basis of picture information and then the recording sheet is pressed by pressure rollers, so that a picture is developed on the recording sheet.

In the case of the photo-pressure sensitive recording sheet of the transfer type, exposure is performed on the microcapsule sheet on the basis of picture information, and then both the microcapsule sheet and the developer sheet put on each other are pressed by pressure rollers, so that a picture is developed on the developer sheet. (Reference is made to Japanese Patent Unexamined Publication No. 61-129971/1986).

In the case of the photo-pressure sensitive recording sheet of the self-coloring type, when the recording sheet is passed between a pair of pressure rollers so as to be pressed by the pressure rollers, the contents of the broken microcapsules, etc. adhere to the pressure rollers. In the case of the photo-pressure recording sheet of the transfer type, on the other hand, when both the microcapsule sheet and the developer sheet put on each other are passed between a pair of pressure rollers so as to be pressed by the pressure rollers, the contents, etc. of the broken microcapsules flow out from the peripheral edges of the developer sheet and the microcapsule sheet and adhere to the pressure rollers.

If the contents of the microcapsules etc. adhere to the surfaces of the pressure rollers, the surfaces become uneven so that the pressure fixing becomes unequal and an unclear picture is formed on the photo-pressure sensitive recording sheet or the developer sheet.

Further, if a developer sheet is passed between the pair of pressure rollers on which microcapsules or the contents of the microcapsules, etc. have adhered, minute scraps of the developer sheet may further adhere to the attached microcapsules or the contents of microcapsules, so that the uneven portions on the surfaces of the pressure rollers are further enlarged. Accordingly, a picture formed on the recording sheet or the developer sheet is made further unclearer.

SUMMARY OF THE INVENTION

It is therefore an object of the present invention to solve the problems in the prior art.

It is another object of the present invention to provide a recording apparatus in which microcapsules or contents or microcapsules attached on the surfaces of the pressure rollers are removed so as to form a clear picture on the photo-pressure sensitive recording sheet.

In order to achieve the above-mentioned objects, the recording apparatus according to the present invention comprises exposing means for exposing a photo-pressure recording sheet carrying at least microcapsules on a surface thereof, pressing means for pressing the exposed photo-pressure recording sheet so as to break ones of the microcapsules, and cleaning means provided in the vicinity of the pressing means for removing microcapsules attached to the pressing means.

BRIEF DESCRIPTION OF THE DRAWING

Other features and advantages of the present invention will be apparent from the following description taken in connection with the accompanying drawing wherein.

DETAILED DESCRIPTION OF PREFERRED EMBODIMENTS

Figure 1:
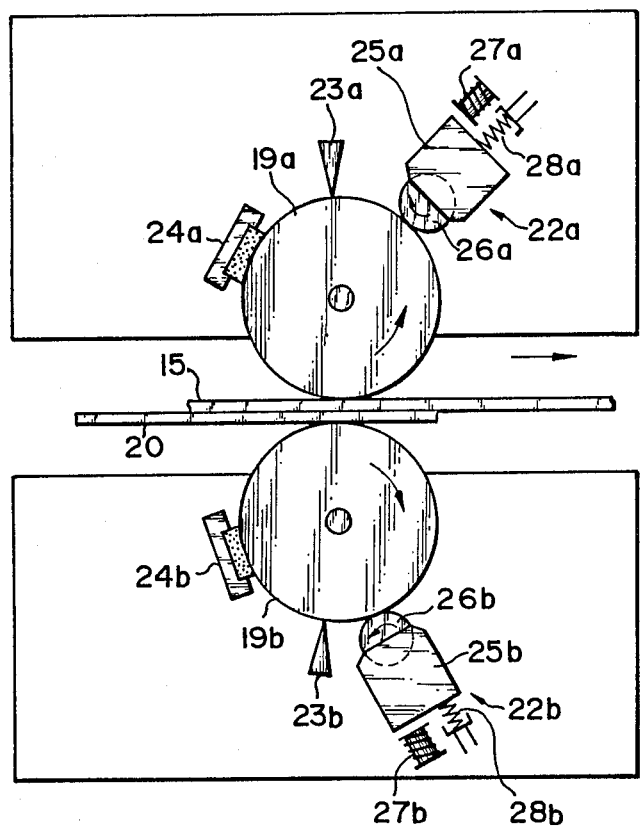
FIG. 1 is a cross-section showing a main portion of an embodiment of the present invention.

Referring to the drawings, embodiment of the copying apparatus according to the present invention will be described hereunder.

Figure 2:
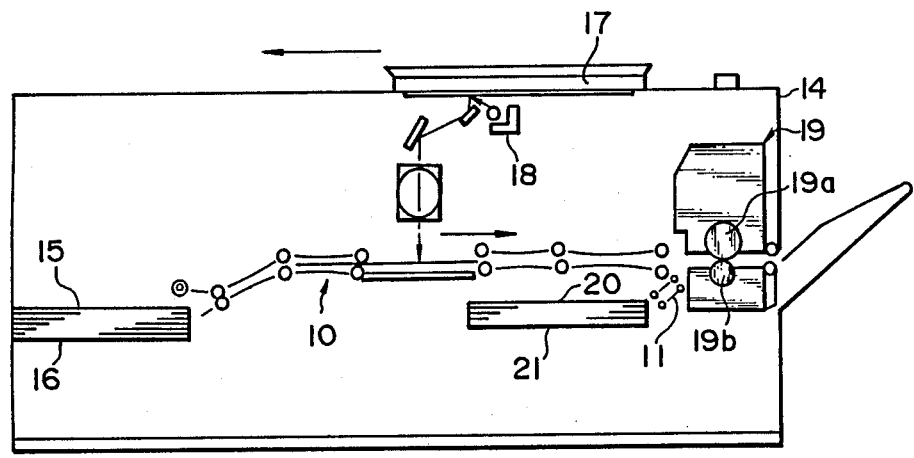
FIG. 2 is a cross-section showing a whole of the embodiment.

Referring to FIGS. 1 and 2, a first embodiment of the present invention will be described. A sheet accommodation cassette 16 for accommodating microcapsule sheets 15 is removably mounted in a copying apparatus 14 at its left side in FIG. 2. On an upper surface of the copying apparatus 14, an original mount 17 is provided and arranged so as to be moved leftward in the drawing by a not-shown conveyor. In the copying apparatus 14, the microcapsule sheet 15 can be moved by a conveyor 10 from left to right in the drawing, in synchronism with the movement of the original mount 17. A light source 18 for irradiating an original put on the original mount 17 is provided under the original mount 17, so that the light radiated from the light source 18 is reflected on the original so as to be focused on the microcapsule sheet 15 being moved in the copying apparatus 14 to thereby form a latent image on the microcapsule sheet 15 in accordance with the original. The microcapsule sheet 15 on which the latent image has been formed is conveyed by the conveyor 10 to a pressure developing device 19 provided in the apparatus 14 at its right side in FIG. 2. Another sheet accommodation cassette 21 for accommodating developer sheets 20 is provided under the conveyor 10, so that the developer sheet 20 is conveyed by another conveyer 11 to the pressure developing device 19. The pressure developing device 19 is provided with a pair of pressure rollers 19a and 19b. The microcapsule sheet 15 and the developer sheet 20 conveyed by the conveyors 10 and 11 respectively are put on each other and pressed by the pair of pressing rollers 19a and 19b so that the latent image formed on the microcapsule sheet 15 is developed on the developer sheet 20.

As shown in FIG. 1, organic-solvent application devices 22a and 22b, blades 23a and 23b, and felt pads 24a and 24b are provided in the surrounding of the pressure rollers 19a and 19b, respectively, for removing the contents, (for example, a dye-precursor, outer shells, or the like) of microcapsules adhered to the pressure rollers 19a and 19b. The organic-solvent application devices 22a and 22b are provided with sponge portions 25a and 25b impregnated with an organic solvent and application rollers 26a and 26b being in contact with the sponge portions 25a and 25b for applying the organic solvent to the pressure rollers 19a and 19b, respectively. As the pressure rollers 19a and 19b are rotated, a new organic solvent is applied to the pressure rollers 19a and 19b by the application rollers 26a and 26b, respectively. In that case, alcohol, acetone, or the like, may be used as the organic solvent.

The blades 23a and 23b are made to touch the rotating pressure rollers 19a and 19b so as to remove the contents of microcapsules, etc. dissolved in the organic solvent. Further, the felt pads 24a and 24b are made to closely touch the rotating pressure rollers 19a and 19b so as to completely remove the contents of the microcapsules, etc. which have not been removed by the blades 23a and 23b, respectively.

Accordingly, even if the contents of the microcapsules, etc. adhere to the pressure rollers 19a and 19b, the contents, etc. can be removed by the blades 23a and 23b and the felt pads 24a and 24b, any uneven portion is not formed on the pressure rollers 19a and 19b. Accordingly, a clear picture is formed on the developer sheet 20 which is pressure-fixed by the pressure rollers 19a and 19b. Since no contents of microcapsules have adhered to the pressure rollers 19a and 19b, a smaller torque suffices to rotate the pressure rollers 19a and 19b than that in the case where the contents of microcapsules have adhered the pressure rollers.

Solenoids 27a and 27b and springs 28a and 28b are provided behind the organic-solvent application device 22a and 22b, respectively, for making the pressure rollers 19a and 19b, removably touch the application roller 26a and 26b. When pressing and fixing processing is not carried out, the application rollers 26a and 26b are separated from the pressure rollers 19a and 19b so as to prevent the consumption of the organic solvent.

Figure 3:
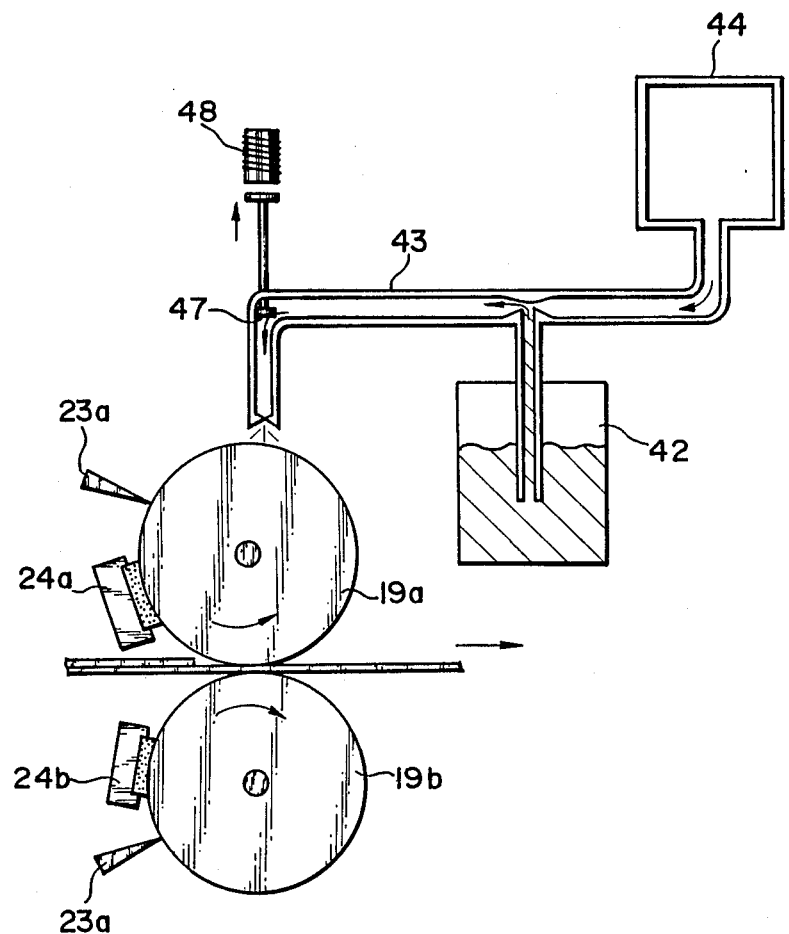
FIG. 3 is a cross-section showing another embodiment, and corresponding to FIG. 1.

FIG. 3 shows a second embodiment of the present invention employing another mechanism for removing microcapsules, etc. attached to the pressure rollers 19a and 19b. The same members as those in the embodiment described above are correspondingly referenced and the detailed description about them will be omitted.

The second embodiment employs an arrangement in which an organic solvent is sprayed onto the pressure rollers 19a and 19b. The organic solvent (the same solvent as that used in the embodiment described above) is stored in a vessel 42. A high-pressure gas (a flon gas in this embodiment) is contained in a vessel 44. The organic solvent in the vessel 42 is sprayed onto the pressure rollers 19a and 19b through a pipe 43 together with the gas jetted from the vessel 44. In the drawing, the mechanism for spraying the organic solvent onto the lower roller 19b is omitted for simplifying the drawing. Further, a valve 47 is attached in the pipe 42 and the opening of the valve 47 is controlled by a solenoid 48. The same effect as that in the first embodiment can be obtained in the second embodiment employing such a mechanism as described above.

In the first and second embodiments, the sheet pressing means is constituted by the pressure rollers 19a and 19b. In the first embodiment, the attached matter cleaning means is constituted by the application rollers 26a and 26b and the organic solvent, and in the second embodiment, the attached foreign matter cleaning means is constituted by the organic solvent, the high-pressure gas, the pipe 43, and the valve 47. However, the present invention is not limited to those embodiments, but various modifications may be realized with respect to the attached foreign matter cleaning means, and the pressure rollers as long as the modified means can remove the attached matter and can press and break ones of the microcapsules.

Accordingly, in the recording apparatus according to the present invention, a clear picture can be formed on a photopressure recording sheet.

What is claimed is:

1. A recording apparatus comprising:
   exposing means for exposing a photo-pressure recording sheet carrying at least microcapsules on a surface of said photo-pressure recording sheet;
   pressing means for pressing the exposed photo-pressure recording sheet so as to break ones of said microcapsules; and
   cleaning means provided in the vicinity of said pressing means for removing foreign matters mainly containing the contents of microcapsules and attached to said pressing means.

2. A recording apparatus according to claim 1, in which said pressing means includes a pair of pressure rollers, and in which said cleaning means includes at least a pair of organic solvent application means for applying organic solvent to said pressure rollers respectively.

3. A recording apparatus according to claim 2, in which said cleaning means further include a pair of blade for removing said foreign matters dissolved in said organic solvent from the surfaces of said pressure rollers respectively.

4. A recording apparatus according to claim 3, in which said cleaning means further include a pair of felt pads for removing the remainder foreign matters from the surfaces of said pressure rollers respectively.

5. A recording apparatus according to claim 2, in which each of said pair of organic solvent application means respectively include a pair of sponge members impregnated with the organic solvent and a pair of organic solvent application rollers being in contact with said sponge members for applying the organic solvent to said pressure rollers respectively.

6. A recording apparatus according to claim 1, in which said pressing means includes a pair of pressure rollers, and in which said cleaning means includes at least a pair of organic solvent spray means for spraying organic solvent to said pressure rollers respectively.

7. A recording apparatus according to claim 6, in which said pair of solvent spray means respectively include a first pair of vessels accommodating the organic solvent therein, a second pair of vessels for containing a high-pressure gas therein, a pair of pipes respectively communicated with said first and second pairs of vessels and having opening ends for spraying the organic solvent together with said high pressure gas onto said pair of pressure rollers respectively.

8. A recording apparatus according to claim 7, in which said pair of solvent spray means further include a pair of valves disposed in said pair of pipes so as to control the spray of said organic solvent out of said pipes respectively, the opening of said valves being controlled by solenoids respectively.

* * * * *